United States Patent [19]

Battjes

[11] 4,236,119
[45] Nov. 25, 1980

[54] MONOLITHIC WIDEBAND AMPLIFIER

[75] Inventor: Carl R. Battjes, Portland, Oreg.

[73] Assignee: Tektronix, Inc., Beaverton, Oreg.

[21] Appl. No.: 941,821

[22] Filed: Sep. 11, 1978

[51] Int. Cl.³ ............................................. H03F 3/04
[52] U.S. Cl. ................................... 330/288; 330/293; 330/311
[58] Field of Search ........................... 307/315; 323/4; 330/288, 291, 296, 293

[56] References Cited

U.S. PATENT DOCUMENTS

| | | | |
|---|---|---|---|
| 3,332,028 | 6/1967 | Kayser et al. | 307/315 X |
| 3,573,645 | 4/1971 | Wheatley, Jr. | 330/273 |
| 3,979,688 | 9/1976 | Maidique | 330/261 |

OTHER PUBLICATIONS

Brokaw et al., "A Fast, High-Precision, Laser-Trimmed FET Input Operational Amplifier", 1974 *IEEE International Solid-State Circuits Conference*, pp. 142, 143, 244, Feb. 14, 1974.

*Primary Examiner*—James B. Mullins
*Attorney, Agent, or Firm*—George T. Noe

[57] ABSTRACT

A Darlington-connected transistor pair is modified by the addition of a third transistor to form a three-terminal composite transistor wideband amplifier the current gain of which is approximately double that of a single transistor.

5 Claims, 3 Drawing Figures

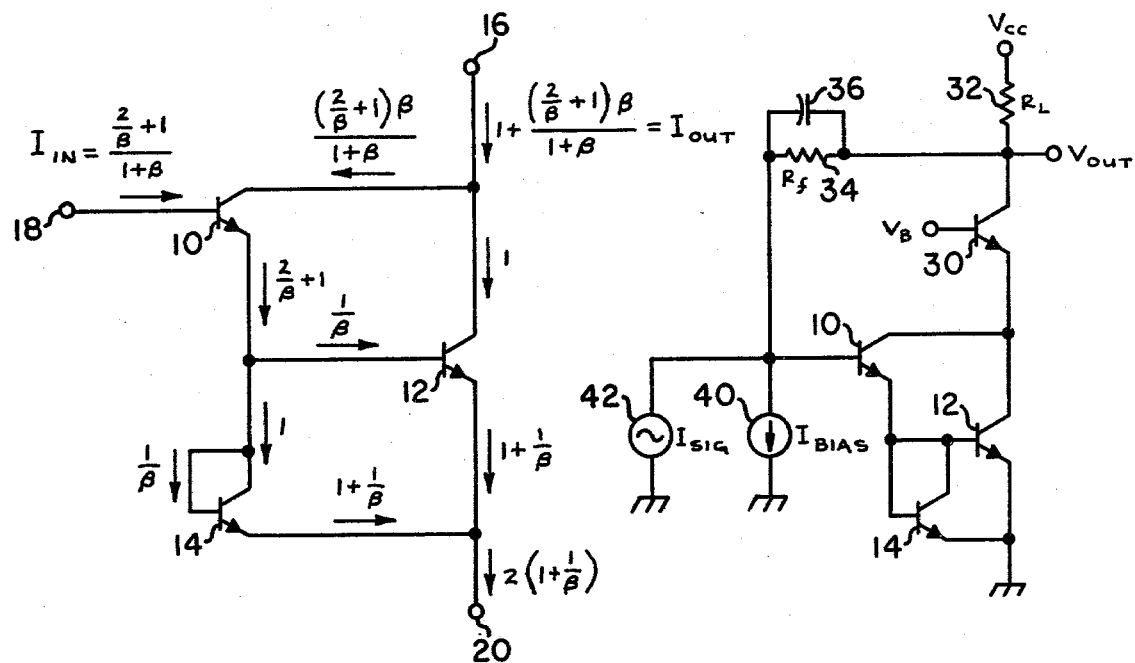
FIG 1
FIG 3
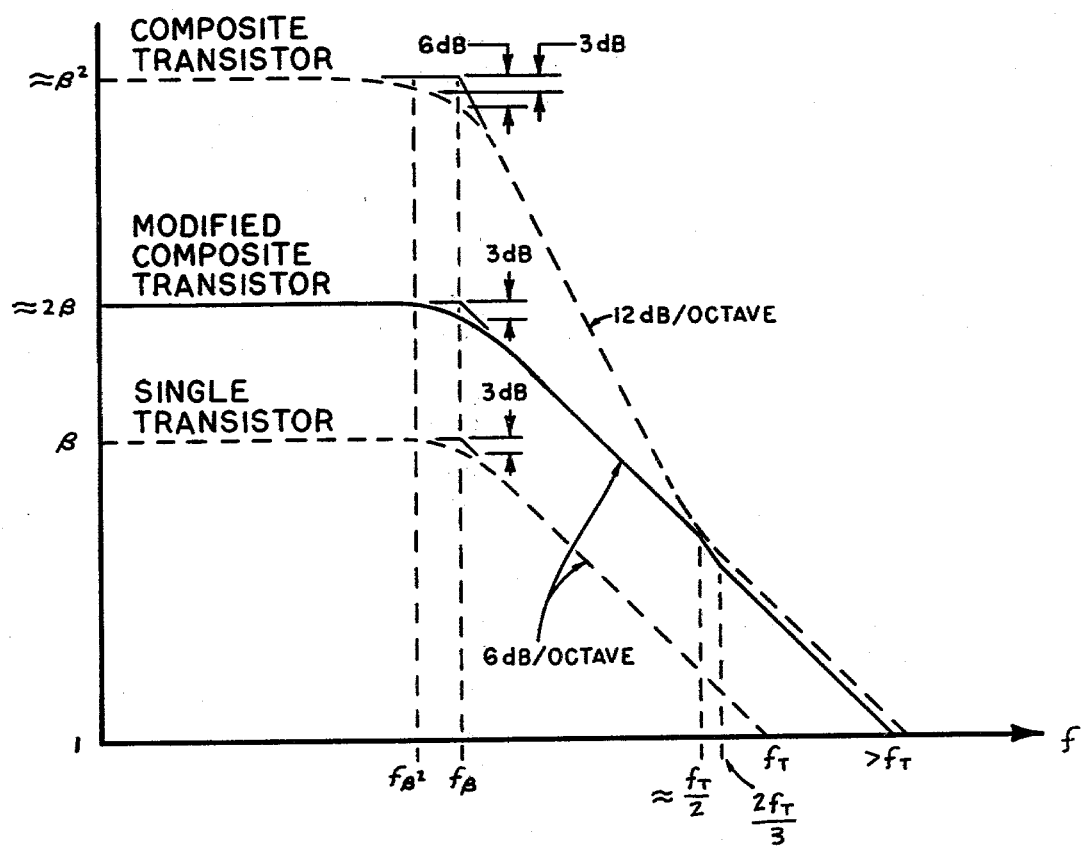
FIG 2

MONOLITHIC WIDEBAND AMPLIFIER

BACKGROUND OF THE INVENTION

The present invention relates to amplifiers in general, and more particularly to a monolithic wideband amplifier.

In a transistor amplifier, high frequency behavior is limited by diffusion capacitance which is intrinsic to the device, the predominant capacitance being that of the base-emitter junction. The small-signal current gain ($h_{fe}$ or $\beta$) as plotted versus frequency remains fairly flat over a range of low frequencies, and then rolls off at about 6 decibels per octave as the frequency is increased beyond the beta cutoff frequency $f_\beta$, the frequency where the magnitude of current gain $\beta$ is 3 decibels down from its low frequency value. The frequency at which the current gain decreases to unity is designated $f_T$.

Darlington composite transistors are useful as input amplifiers because they provide a high input impedance and they are operable at low biasing currents. The small-signal current gain at low frequencies is equal to $\beta_1 \beta_2$, or simply $\beta^2$ where the two base-emitter junctions of the Darlington pair are substantially identical. In plotting the frequency response, the logarithmic value of gain rolls off at a rate of 12 decibels per octave as frequency is increased above the $\beta$-cutoff frequency point. In general, 9 or 10 decibels per octave is considered to be the maximum allowable for good amplifier stability.

Associated with the transfer function of an amplifier and the frequency response thereof is the phase response of beta. For a single transistor amplifier, the phase shift ideally is zero at about $0.1f_\beta$, 45 degrees at $f_\beta$, and 90 degrees at about $10f_\beta$. For a Darlington-connected pair of transistors, the maximum phase shift over the frequency range is near 180 degrees because two base-emitter junctions are involved. This makes the design of wideband feedback amplifier circuits employing the Darlington configuration difficult or impossible because the well known Bode criteria for a stable condition must be satisfied to prevent instability or oscillation.

SUMMARY OF THE INVENTION

In accordance with the present invention, an improved wideband amplifier is provided wherein a Darlington-connected transistor pair is modified by an additional transistor.

A Darlington-connected transistor pair includes a first transistor the emitter of which is connected to the base of a transistor of the same conductivity type. The collectors of the two transistors are connected together so that a three-terminal composite transistor is formed in which the collectors provide a first terminal, the base of the first transistor provides a second terminal, and the emitter of the second transistor provides a third terminal.

A third transistor, the collector and base of which are connected together to form a diode, is connected across the base-emitter junction of the second transistor in the above-described Darlington-connected transistor pair. The addition of the third transistor lowers the current gain of the overall amplifier structure from about $\beta^2$ to about $2\beta$, while providing an effective $f_T$ which is 1.5 to 2 times that of a single transistor. Additionally, the gain rolls off at a 6 decibels per octave rate rather than the 12 decibels per octave rate of the uncontrolled Darlington configuration, and the corresponding phase response is free of the excessive phase shift of the uncontrolled Darlington configuration. With the stabilized response thus provided, such an amplifier is suitable for use as an amplifier with feedback.

The modified Darlington amplifier preferably is fabricated using standard monolithic integrated circuit techniques so as to ensure matched operating characteristics of the constituent components.

It is therefore one object of the present invention to provide an improved wideband amplifier.

It is another object to provide a wideband transistor amplifier for which the current gain is substantially doubled over that of a single transistor amplifier.

It is a further object to provide a wideband transistor amplifier characterized by a higher frequency at which the current gain reduces to unity.

It is an additional object to provide a modified composite transistor amplifier wherein the current gain rolls off at 6 decibels per octave at high frequencies and wherein the phase shift characteristic is within stability limits.

Other objects and advantages of the present invention will become apparent to those having ordinary skill in the art when taken in conjunction with the accompanying drawings.

BRIEF DESCRIPTION OF THE DRAWINGS

FIG. 1 is a schematic diagram of a modified composite transistor amplifier in accordance with the present invention;

FIG. 2 shows a gain versus frequency plot of the amplifier of FIG. 1; and

FIG. 3 shows the amplifier of FIG. 1 connected as a feedback amplifier.

DETAILED DESCRIPTION

Referring to FIG. 1, a wideband amplifier comprises three transistors 10, 12 and 14 of the same conductivity type connected to form a modified composite transistor having a collector terminal 16, a base terminal 18, and an emitter terminal 20. The emitter of transistor 10 is connected to the base of transistor 12, and the collectors of transistors 10 and 12 are connected together. Transistor 14, the collector and base of which are connected together to form a diode, is connected across the base-emitter junction of transistor 12.

The operation of the FIG. 1 circuit is best understood in terms of mathematical relationships. It is assumed that transistors 10, 12 and 14 are matched and therefore have substantially identical operating characteristics, and it is further assumed that one unit of collector current flows into transistor 12 to provide a basis for establishing the remaining current expressions shown. The DC current gain may be calculated as follows:

$$\frac{I_{OUT}}{I_{IN}} = \beta \frac{2\beta + 3}{\beta + 2} \approx 2\beta \text{ for } \beta > 2. \tag{1}$$

For high frequencies, let $$\beta = \frac{1}{T_{TS}}$$

where $$T_T = \frac{1}{2\pi f_T}$$

and s is the LaPlace transform operator.
Then $$\frac{I_{OUT}}{I_{IN}} = \left(\frac{2}{T_{TS}}\right) \frac{(1 + \frac{3}{2} T_{TS})}{(1 + 2 T_{TS})} \qquad (2)$$

On a log-log gain versus frequency plot, the approximate $2\beta$ value calculated in equation (1) remains constant as frequency is increased to infinity; and the results of equation (2) produces a 45° sloping line depicting that the gain rises from $\beta = 1$ at frequency $f_T$ to infinity at DC, or zero frequency. These two equations provide a piecewise linear approximation of the amplifier frequency response, and the point where the lines cross is the pole frequency, or $\beta$-cutoff frequency $f_\beta$.

From the foregoing mathematical approximations, the overall frequency response may now be calculated for the modified composite transistor by letting $$\beta = \frac{\beta_o}{1 + T_\beta s}$$

where $$\beta_o = \frac{f_T}{f_\beta}$$

and $T_\beta = \beta_o T_T$ and substituting for $\beta$ in equation (1):

$$\frac{I_{OUT}}{I_{IN}} = \frac{(1 + \frac{3}{2\beta_o})(1 + \frac{\frac{3}{2} T_\beta s}{\beta_o + \frac{3}{2}})(2\beta_o)}{(1 + \frac{2}{\beta_o})(1 + \frac{2 T_\beta s}{2 + \beta_o})(1 + T_\beta s)} \qquad (3)$$

A plot of the current gain versus frequency as derived from equation (3) is shown as the solid line in FIG. 2, and depicts the frequency response of the modified composite transistor. Also shown in FIG. 2 in dashed lines for purposes of comparison are the frequency response curves for a single transistor and for a Darlington composite transistor.

Referring the response curves of FIG. 2, the response for a single transistor is depicted by a standard textbook plot wherein the current gain is $-3$ decibels (dB) at the pole frequency $f_\beta$ and rolls off at 6 dB/octave until unity gain is reached at $f_T$. For a Darlington composite transistor, which transistors 10 and 12 alone would form, the small-signal current gain is equal to $\beta^2 + 2\beta$ for matched transistors, or approximately $\beta^2$ where $\beta$ is large. In the response curve, there are two poles at frequency $f_\beta$ and a zero at about $\frac{1}{2} f_T$, resulting in the break points shown. In the response curve for the modified composite transistor depicted by the solid line, there are poles at $f_\beta$ and about $\frac{1}{2} f_T$ and a zero at $\frac{2}{3} f_T$. Parameters such as effective $f_T$ and phase shift may be determined from equation (3), which is converted from the s domain to the more familiar complex frequency form by use of LaPlace transforms. The effective $f_T$ has been calculated to be 1.554 times the $f_T$ of a single transistor. Maximum phase shift at about $\frac{1}{2} f_T$ has been calculated to be $-98.2$ degrees, or about 8 degrees excess phase shift at $\frac{1}{2} f_T$.

Thus it can be discerned that for the composite transistor of the present invention not only is the current gain substantially twice that of a single transistor and the effective $f_T$ thereof 1.5 to 2 times that of a single transistor, but the corresponding phase response is free of the excessive phase shift of the uncontrolled Darlington configuration. Such a modified composite transistor preferably is fabricated using standard monolithic integrated circuit techniques so that the transistors 10, 12 and 14 may be carefully matched to ensure substantially identical operating characteristics.

FIG. 3 shows the modified composite amplifier of FIG. 1 in a feedback amplifier embodiment. The emitters of transistors 12 and 14 are connected to ground. The collectors of transistors 10 and 12 are connected to the emitter of a transistor 30, which is operated as a common-base amplifier. The collector of transistor 30 is connected through a load resistor 32 to a source of positive voltage $V_{cc}$. A feedback resistor 34 paralleled by a speed-up capacitor 36 is connected between the collector of transistor 30 and the base of transistor 10. A bias current cource 40 and a signal current generator 42 are also connected to the base of transistor 10 to provide operation of the circuit. The output voltage signal is taken from the collector of transistor 30. A feedback amplifier of this configuration has been fabricated and tested, and stable operation of a frequency range of DC to 50 megahertz has been observed.

While I have shown and described preferred embodiments of my invention, it will be apparent to those skilled in the art that many changes and modifications may be made without departing from my invention in its broader aspects. The appended claims thereof cover all such changes and modifications as fall therewithin.

What I claim as being new is:

1. A wideband amplifier, comprising: first, second, and third transistors forming a three-terminal composite transistor in which the collectors of said first and second transistors are connected in common to a first terminal, the base of said first transistor is connected to a second terminal, the emitter of said first transistor is connected to the base of said second transistor, the collector and base of said third transistor are connected to the base of said second transistor, and the emitters of said second and third transistors are connected in common to a third terminal;

wherein said first, second, and third transistors are matched and have substantially identical operating characteristics so that the DC current gain of said three-terminal composite transistor is equal to $\beta(2\beta + 3)/(\beta + 2)$.

2. An amplifier in accordance with claim 1 wherein said first, second, and third transistors are all of the same conductivity type.

3. An amplifier in accordance with claim 1 wherein said amplifier is realized in monolithic integrated circuit form.

4. An amplifier in accordance with claim 1 wherein the current gain as a function of frequency is defined as

TABLE 1

| Conduits | °F. | Flow Rate #/hr. |
|---|---|---|
| line 30 | 1800 | 75,791 |
| line 40 | 850 | 372,000 |
| line 54 | 700 | 372,000 |

TABLE 1-continued

| Conduits | °F. | Flow Rate #/hr. |
|---|---|---|
| line 56 | 400 | 78,700 |
| line 70 | 300 | 78,700 |
| line 22 | 750 | 36,624 |
| line 24 | 750 | 18,312 |
| line 28 | 750 | 2,812 |

5. An amplifier in accordance with claim 1 further including a feedback path having at least one impedance element coupled from the collectors of said first and second transistors to the base of said first transistor.

* * * * *

UNITED STATES PATENT AND TRADEMARK OFFICE
CERTIFICATE OF CORRECTION

PATENT NO. : 4,236,119
DATED : Nov. 25, 1980
INVENTOR(S) : Carl R. Battjes

It is certified that error appears in the above-identified patent and that said Letters Patent are hereby corrected as shown below:

Col. 1, line 28, change "cuttoff" to --cutoff--.

Col. 1, line 36, change "10fβ" to --10f$_\beta$--.

Col. 4, line 35, change "thereof" to --therefore--.

Cols. 4, 5, and 6, change "Table 1" to $$-- \frac{I_{OUT}}{I_{IN}} = \frac{(1+\frac{3}{2\beta_0})(1+\frac{\frac{3}{2}T_\beta s}{\beta_0+\frac{3}{2}})(2\beta_0)}{(1+\frac{2}{\beta_0})(1+\frac{2T_\beta s}{2+\beta_0})(1+T_\beta s)} \cdot --$$

Signed and Sealed this

Fourteenth Day of April 1981

[SEAL]

Attest:

RENE D. TEGTMEYER

Attesting Officer

Acting Commissioner of Patents and Trademarks